United States Patent [19]
den Hollander

[11] B 3,993,931
[45] Nov. 23, 1976

[54] GATING CIRCUIT FOR THYRISTOR DEFLECTION SYSTEM

[75] Inventor: Willem den Hollander, Schlieren, Switzerland

[73] Assignee: RCA Corporation, New York, N.Y.

[22] Filed: Oct. 21, 1974

[21] Appl. No.: 516,564

[44] Published under the second Trial Voluntary Protest Program on February 17, 1976 as document No. B 516,564.

[30] Foreign Application Priority Data
Aug. 22, 1974 United Kingdom............... 36948/74

[52] U.S. Cl. .............................................. 315/408
[51] Int. Cl.² .......................................... H01J 29/70
[58] Field of Search ........................... 315/408, 399

[56] References Cited
UNITED STATES PATENTS

| | | | |
|---|---|---|---|
| 3,452,244 | 6/1969 | Dietz................................... | 315/408 |
| 3,517,253 | 6/1970 | Dietz................................... | 315/408 |
| 3,638,067 | 1/1972 | Dietz................................... | 315/408 |
| 3,767,960 | 10/1973 | Ahrens................................. | 315/408 |
| 3,767,963 | 10/1973 | McArdle............................. | 315/408 |

*Primary Examiner*—Maynard R. Wilbur
*Assistant Examiner*—G. E. Montone
*Attorney, Agent, or Firm*—Eugene M. Whitacre; Paul J. Rasmussen

[57] ABSTRACT

A gating circuit for a deflection system which includes a first switch which is coupled to a deflection winding for supplying energy to the deflection winding during a trace interval of each deflection cycle. A commutating network including a second switch is coupled to the deflection winding and supplies energy to the deflection winding during a commutating interval of each deflection cycle. A coupling network couples a first polarity portion of gating signals developed by the commutating network to the first switch during the trace interval to enable conduction of the first switch. The coupling network also provides a second polarity portion of the gating signals to the first switch during the commutating interval to enable the turn off of the first switch.

9 Claims, 2 Drawing Figures

3,993,931

GATING CIRCUIT FOR THYRISTOR DEFLECTION SYSTEM

BACKGROUND OF THE INVENTION

This invention relates to a gating circuit for controlling a switching device employed in a deflection circuit.

Various deflection system designs have been utilized in television receivers. One design employing two bidirectional conducting switches and utilizing SCR's (thyristors) as part of the switches is disclosed in U.S. Pat. No. 3,452,244. In this type deflection system, a first SCR is employed for coupling a deflection winding to a source of energy during a trace interval of each deflection cycle and a commutating network including a second SCR is utilized for storing energy and for supplying the stored energy to the deflection winding during a commutation interval of each deflection cycle. The first SCR is commonly provided with gating voltage by means of a separate winding or tap of an input reactor coupling a source of direct current to the second SCR and the commutating network.

Various regulator system designs have been utilized in conjunction with the above-described deflection system to provide for uniform high voltage production as well as uniform picture width with varying line voltage and kinescope beam current conditions.

One type regulator system design alters the amount of energy stored in the commutating network between commutating intervals. A regulator design of this type may utilize a regulating SCR and diode for coupling the input reactor to the source of B+. With this type regulator the current is interrupted such that a notch, the width of which depends upon the regulation requirements, is created in the current supplied through the reactor and which notch shows up in the voltage waveform developed on the separate winding or tap of the input reactor which provides the gating voltage for the first SCR. The presence of the notch, even though de-emphasized by a waveshaping circuit coupling the gating voltage to the first SCR, creates a negative voltage on and a resulting negative current into the gate of the SCR during conduction. This condition may result in over dissipation and ultimate failure of the gate-cathode junction of the first SCR.

SUMMARY OF THE INVENTION

In accordance with one embodiment of the invention, a gating circuit of a deflection system includes a first switching means coupled to a deflection winding for supplying energy to the deflection winding during a time interval of each deflection cycle. A commutating means coupled to the deflection winding supplies energy to the deflection winding during a commutating interval of each deflection cycle. A coupling means coupled to the commutating means and the first switching means provides a first polarity portion of gating signals developed by the commutating network to the first switching means during the trace interval to enable conduction of the first switching means. The coupling means also provides a second polarity portion of the gating signals to the first switching means during the commutating interval to enable the turn off of the first switching means.

DESCRIPTION OF THE PREFERRED EMBODIMENT

Figure 1:
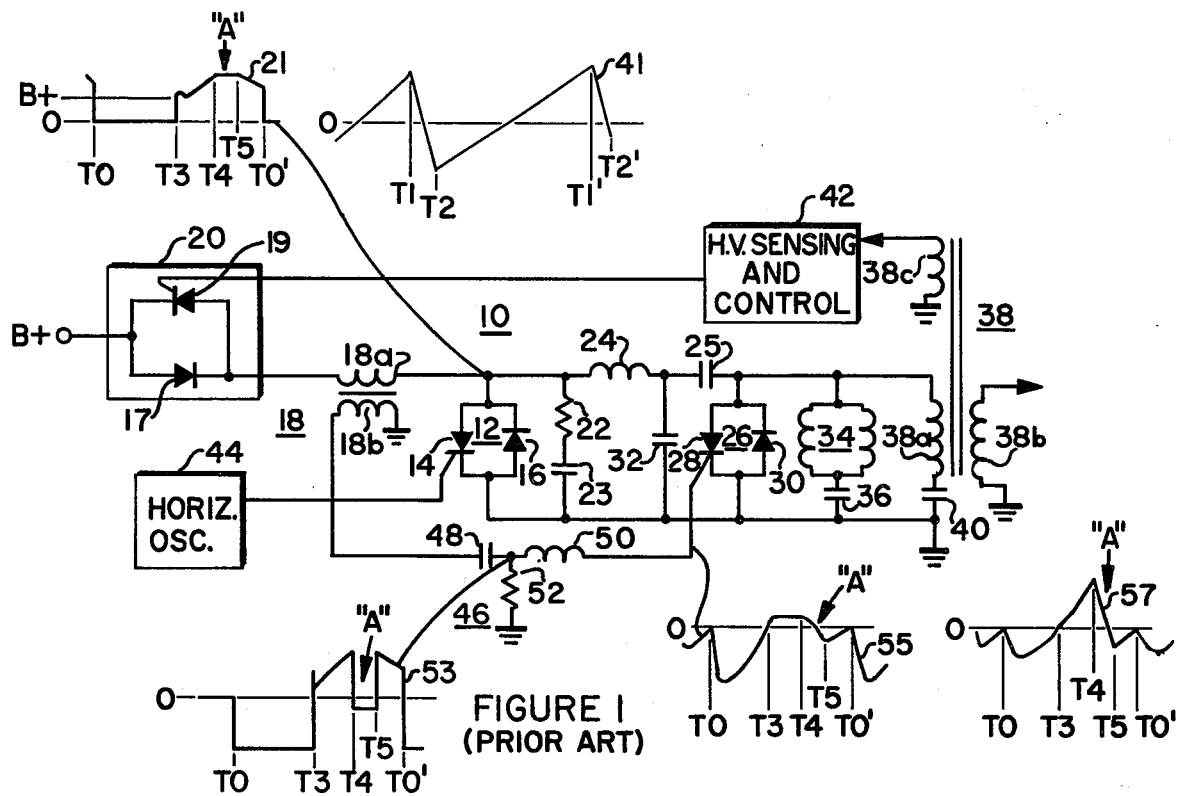
FIG. 1 illustrates a block and schematic circuit diagram of a prior art gating system for a thyristor deflection system.

FIG. 1 is a schematic diagram, partially in block form, of a prior art deflection system of the retrace driven type similar to that disclosed in U.S. Pat. No. 3,452,244. This system includes a commutating switch 12, comprising a silicon controlled rectifier (SCR) 14 and an oppositely poled damper diode 16. The commutating switch 12 is coupled between a winding 18a of an input reactor 18 and ground. The other terminal of winding 18a is coupled to a source of direct current voltage (B+) by means of a regulator network 20 comprising a parallel combination of a diode 17 and a regulating SCR 19, poled as indicated, which controls the energy stored in the deflection circuit 10 when the commutating switch is off (i.e. between commutating intervals), during an interval T3 to T0' as shown in waveform 21 which is a plot of the voltage level at the anode of SCR 14 during the deflection cycle. A damping network comprising a series combination of a resistor 22 and a capacitor 23 is coupled in parallel with commutating switch 12 and serves to reduce any ringing effects produced by the switching of commutating switch 12.

Commutating switch 12 is coupled through a commutating coil 24, a commutating capacitor 25 and a trace switch 26 to ground. An auxiliary capacitor 32 is coupled between the junction of coil 24 and capacitor 25 and ground. Trace switch 26 comprises an SCR 28 and an oppositely poled damper diode 30. A series combination of a horizontal deflection winding 34 and an S-shaping capacitor 36 is coupled in parallel with trace switch 26. Also, a series combination of a primary winding 38a of a horizontal output transformer 38 and a DC blocking capacitor 40 is coupled in parallel with trace switch 26.

A secondary winding 38b of transformer 38 produces flyback pulses during the retrace interval of each deflection cycle. This interval exists between T1 and T2 of waveform 41 which is a plot of the current through windings 34 and 38a during the deflection cycle. These flyback pulses are applied to a high voltage multiplier and rectifier assembly (not shown) for producing direct current high voltage for use as the ultor voltage of a kinescope (not shown).

An auxiliary winding 38c of transformer 38 is coupled to a high voltage sensing and control circuit 42 which transforms the level of flyback pulses into a control signal to control the operation of regulator 20. The control circuit 42 is coupled to the gate of regulating SCR 19.

A horizontal oscillator 44 is coupled to the gate electrode of commutating SCR 14 and produces a pulse during each horizontal deflection cycle slightly before the end of the trace interval at T0 of curve 21 to turn on SCR 14 to initiate the commutating interval. The commutating interval occurs between T0 and T3 of curve 21. A resonant waveshaping network 46 comprising a series combination of a capacitor 48 and an inductor 50 coupled between a winding 18b of input choke 18 and the gate electrode of trace SCR 28 and a damping resistor 52 coupled between the junction of capacitor 48 and inductor 50 and ground shapes the signal developed by winding 18b which is essentially a waveform 53 with a shifted zero voltage axis to form a signal at the junction of capacitor 48 and inductor 50 as illustrated by voltage waveform 53 and a gating signal at the gate of SCR 28 as illustrated by voltage waveform 55. The gating signal enables SCR 28 for conduction during the second half of the trace interval occurring between T2 and T1' of curve 41.

The regulator network 20 operates in such a manner that current through winding 18a of input reactor 18 during an interval between T4 and T5 [(region "A") of curves 21, 53 and 55] is interrupted for a period of time the duration of which is determined by the signal produced by the high voltage sensing and control circuit 42 to control the discharge of capacitor 25 thereby controlling the energy stored in capacitor 25 between commutating intervals (i.e. T3–T0'). During the interruption of current through winding 18a a negative voltage level is developed at the junction of capacitor 48 and inductor 50 as shown in interval T4 to T5 of curve 53. The resonant waveshaping circuit 46 produces the shaped voltage waveform 55 which also goes negative during the interval T4 to T5 and produces an undesirable negative gate current in SCR 28 as shown in gate current waveform 57. During this period SCR 28 is conductive, therefore a high gate-cathode junction power dissipation occurs which may result in subsequent failure of the SCR 28.

Figure 2:
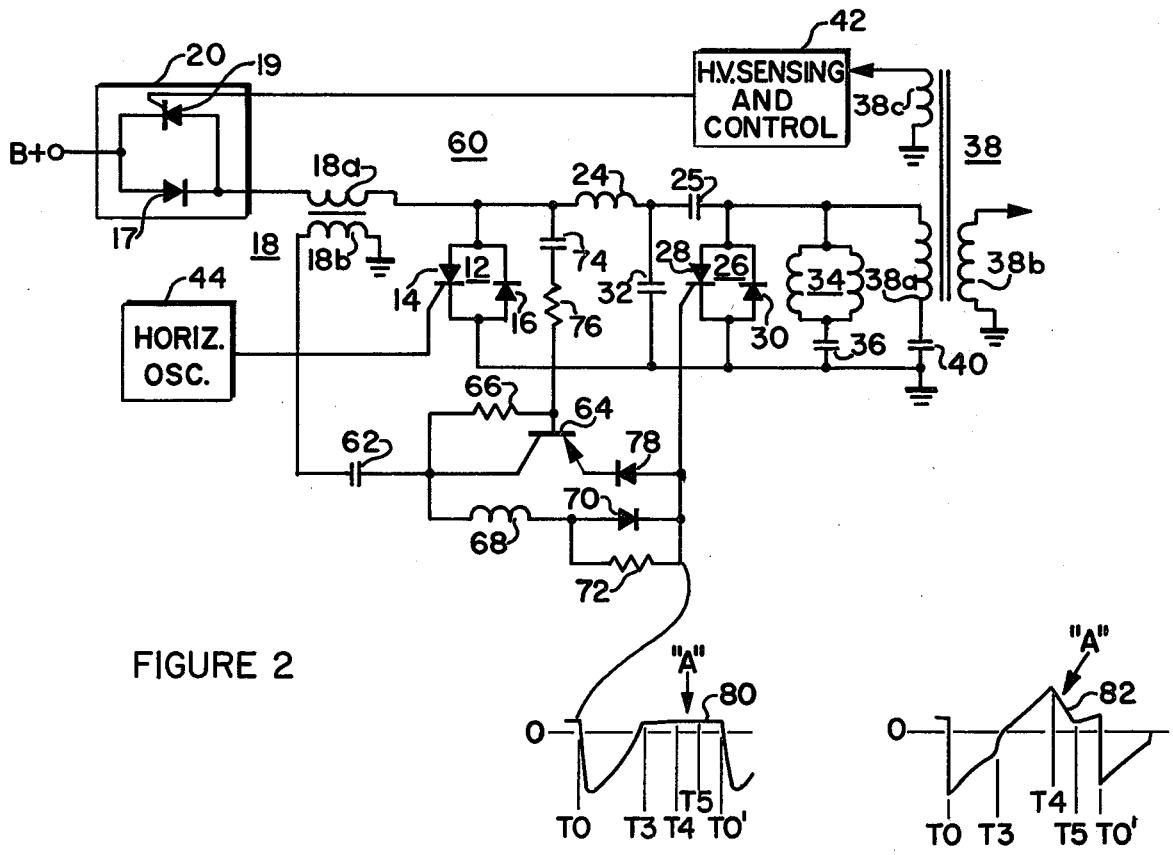
FIG. 2 illustrates an improved gating circuit for a thyristor deflection system in accordance with the invention.

FIG. 2 is a schematic diagram, partially in block form, of a deflection system 60 embodying a gating circuit according to the invention. Those elements which perform the same function in FIG. 2 as in FIG. 1 are labeled with the same reference numerals. FIG. 2 differs from FIG. 1 essentially in that an improved gating circuit is utilized for driving the trace SCR 28.

A capacitor 62 couples the gating signal developed by winding 18b through a forward (i.e. positive) drive current path comprising an inductor 68 and a parallel combination of a diode 70 and a transient suppression resistor 72 to the gate electrode of trace SCR 28 of trace switch 26. Capacitor 62 and inductor 68 form a resonant circuit which peaks the gating waveform 80 at a region A between T3 and T4 thus insuring proper gating of SCR 28 during the second half of the trace period.

A conduction path for conducting reverse (i.e. negative) gating current is coupled between the gate electrode of trace SCR 28 and capacitor 62 and comprises a series combination of a diode 78 and a transistor 64. This reverse conduction path is in parallel with the forward conduction path comprising inductor 68 and diode 70. A biasing resistor 66 is coupled between the collector electrode and base electrode of transistor 64. Base drive signal is coupled to transistor 64 from the junction of commutating switch 12 and winding 18a of input reactor 18 by means of a series combination of a capacitor 74 and a resistor 76.

In operation the gating signal developed at the junction of capacitor 62 and inductor 68 is similar to that shown in waveform 53 FIG. 1. During the positive portion of the gating signal (i.e. T3 to T4) current as shown in waveform 82 flows from winding 18b to the gate of SCR 28 through capacitor 62, inductor 68 and the parallel combination of diode 70 and resistor 72, developing a voltage at the gate electrode of SCR 28 as shown in waveform 80 between T3 to T4. During normal operation of the deflection circuit as described in the aforementioned patent the anode electrode of SCR 28 goes positive with respect to the cathode electrode during this same time interval and SCR 28 goes into conduction between anode and cathode.

During the time interval T4 to T5 the signal developed by winding 18b goes to zero volts and the voltage at the junction of capacitor 62 and inductor 68 as shown in waveform 53 goes negative due to the charge accumulated on capacitor 62 during time interval T3 to T4. Since the anode of SCR 14 as shown in waveform 21 is at approximately B+ between T3 and T0' and the time constant of capacitor 74, resistor 76, resistor 66 and capacitor 62 is long relative to the time interval T3 to T0', the base-emitter junction of transistor 64 is reverse biased during the interval T3 to T0' thus transistor 64 is cut off. With transistor 64 cut off no significant negative current can flow between the gate electrode of SCR 28 and winding 18b via diode 78 and transistor 64 thus the voltage at the gate of SCR 28 remains positive as shown in waveform 80 and the gate current remains positive due to the energy stored in inductor 68 even though decreasing as shown in waveform 82.

During the interval T5 to T0' the voltage at the junction of capacitor 62 and inductor 68 again becomes positive and the gate current of SCR 28 begins to increase in accordance with that shown in waveform 82.

When SCR 14 conducts at T0', the base of transistor 64 is biased negative with respect to the gate voltage of SCR 28 because of the charge accumulated on capacitor 74 during the interval T3 to T0'. As a result of the current flowing from the gate electrode of SCR 28 through diode 78, the base-emitter junction of transistor 64, resistor 76 and capacitor 74, a proprotionally higher current flows from the gate electrode of SCR 28 through the diode 78, the transistor 64 and capacitor 62 to the winding 18b. The resistor 66 sustains the conduction of transistor 64 after capacitor 64 is discharged, thereby providing for a sustained negative voltage at the gate of SCR 28 throughout the period of conduction of commutating switch 12 thus insuring proper turn off of SCR 28 during the retrace interval.

The aforementioned gating circuit thus prevents negative current through the gate electrode of SCR 28 except for a very short duration of time during the commutation interval when SCR 28 is being turned off which is recommended to enable a fast turn off of SCR 28 to reduce the possibility of over dissipation of SCR 28.

What is claimed is:
1. In a deflection system a gating circuit comprising:
 a first switching means coupled to a deflection winding for supplying a first quantity of energy to said deflection winding during a trace interval of each deflection cycle;
 a commutating means coupled to said deflection winding for supplying a second quantity of energy to said deflection winding during a commutating interval of each deflection cycle; and
 coupling means coupled to said commutating means and said first switching means for providing a first polarity portion of gating signals developed by said commutating means through a first conduction path to said first switching means during said trace interval to enable conduction of said first switching means and for providing a second polarity portion of said gating signals through a second conduction path to said first switching means during said commutating interval to enable the turn off of said first switching means.

2. A gating circuit according to claim 1 wherein said first conduction path includes a first unidirectional current conducting device poled to conduct current in response to said first polarity portion of said gating signals.

3. A gating circuit according to claim 2 wherein said second conduction path includes an active switching device with the main conduction path being coupled between said commutating means and said first switching means and a control terminal being coupled to said commutating means, the main conduction path becoming conductive during said commutating interval.

4. A gating circuit according to claim 3 wherein said commutating means includes a second switching means for initiating said commutating interval and an input reactor for developing said gating signals, said control terminal of said active switching device being coupled to said second switching device and said main conduction path of said active switching device being coupled between said input reactor and said first switching means.

5. A gating circuit according to claim 4 wherein said active switching device is a transistor with the collector electrode to emitter electrode conduction path being the main conduction path and the base electrode being the control terminal.

6. A gating circuit according to claim 5 wherein said second conduction path further includes a second unidirectional current conducting device serially coupled with the collector electrode to emitter electrode conduction path of said transistor and poled to conduct current in response to said second polarity portion of said gating signals.

7. A gating circuit according to claim 6 wherein said first and second unidirectional current conducting devices are diodes.

8. A gating circuit according to claim 7 wherein said second conduction path further includes biasing means coupled to the base electrode and collector electrode for saturating said transistor when said second switching means is conducting.

9. In a deflection system a gating circuit comprising:
a first switching means coupled to a deflection winding for supplying a first quantity of energy to said deflection winding during a trace interval of each deflection cycle;
a commutating means coupled to said deflection winding for supplying a second quantity of energy to said deflection winding during a commutating interval of each deflection cycle;
said commutating means including a second switching means for providing switching to initiate said commutating interval;
first conducting means coupled to said commutating means and to said first switching means for providing a first polarity portion of gating signals developed by said commutating means to said first switching means during said trace interval to enable conduction of said first switching means;
said first conducting means including reactive means for peaking said gating signals to enable conduction of said first switching means at a predetermined point in said trace interval; and
second conducting means coupled in parallel with said first conducting means and to said second switching means for providing a second polarity portion of said gating signals to said first switching means during conduction of said second switching means to enable the turn off of said first switching means during said commutating interval.

* * * * *